United States Patent
Ueno

(10) Patent No.: US 7,700,971 B2
(45) Date of Patent: Apr. 20, 2010

(54) INSULATED GATE SILICON CARBIDE SEMICONDUCTOR DEVICE

(75) Inventor: Katsunori Ueno, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 17 days.

(21) Appl. No.: 12/015,791

(22) Filed: Jan. 17, 2008

(65) Prior Publication Data

US 2008/0173876 A1    Jul. 24, 2008

(30) Foreign Application Priority Data

Jan. 18, 2007    (JP)    ............... 2007-009010

(51) Int. Cl.
H01L 29/78    (2006.01)
(52) U.S. Cl. .................. 257/136; 257/341; 257/266; 257/E29.265; 257/E29.243; 257/E29.257
(58) Field of Classification Search ......... 257/134–136, 257/341, 365, 401, 262–264, 266, 278, 279, 257/285, 330–332, 334, 342, E29.265, E29.243, 257/E29.257
See application file for complete search history.

(56) References Cited

U.S. PATENT DOCUMENTS

| | | | |
|---|---|---|---|
| 5,895,939 A * | 4/1999 | Ueno ........................ | 257/279 |
| 6,091,108 A * | 7/2000 | Harris et al. ................ | 257/339 |
| 6,750,508 B2 * | 6/2004 | Omura et al. ............... | 257/329 |
| 7,154,130 B2 | 12/2006 | Kumar et al. | |
| 2003/0178672 A1 | 9/2003 | Hatakeyama et al. | |
| 2005/0029557 A1 | 2/2005 | Hatakeyama et al. | |
| 2005/0029558 A1 | 2/2005 | Hatakeyama et al. | |
| 2006/0057796 A1 | 3/2006 | Harada et al. | |

(Continued)

FOREIGN PATENT DOCUMENTS

EP    1814162 A1    8/2007

(Continued)

OTHER PUBLICATIONS

Kenji Fukuda et al; "Ultra Low Loss SiC MOSFET and JFET"; Lecture Material; Nov. 10 & 11, 2005; pp. 147-148; National Institute of Advanced Industrial Science and Technology Power Electronics Research Center; Tsukuba-shi Japan.

Primary Examiner—Jerome Jackson, Jr.
Assistant Examiner—Yu Chen
(74) Attorney, Agent, or Firm—Rossi, Kimms & McDowell LLP

(57) ABSTRACT

An insulated gate silicon carbide semiconductor device is provided having small on-resistance. The device combines a static induction transistor structure with an insulated gate field effect transistor structure. The advantages of both the SIT structure and the insulated gate field effect transistor structure are obtained. The structures are formed on the same SiC semiconductor substrate, with the MOSFET structure above the SIT structure. The SIT structure includes a p+ gate region in an n-type drift layer on an n+ SiC semiconductor substrate, and an n+ first source region on the surface of the drift layer. The MOSFET structure includes a p-well region on the surface of the first source region, a second source region formed in the p-well region, and a MOS gate structure formed in a trench extending from the second source region to the first source region. The p+ gate region and a source electrode are conductively connected.

4 Claims, 10 Drawing Sheets

U.S. PATENT DOCUMENTS

2006/0226504 A1 10/2006 Hatakeyama et al.
2008/0197361 A1 8/2008 Ueno

FOREIGN PATENT DOCUMENTS

| | | |
|---|---|---|
| JP | 2001-94097 A | 4/2001 |
| JP | 2004-006723 A | 1/2004 |
| JP | 2004-247496 A | 9/2004 |
| JP | 2006-147789 A | 6/2006 |
| WO | 2004036655 A1 | 4/2004 |

* cited by examiner

US 7,700,971 B2

INSULATED GATE SILICON CARBIDE SEMICONDUCTOR DEVICE

CROSS-REFERENCE TO RELATED APPLICATION

This application claims priority from Japanese Patent Application 2007-009010 filed on Jan. 18, 2007, the content of which is incorporated herein by reference.

BACKGROUND

The present invention relates to a vertical power semiconductor device (hereinafter referred to as "power device") primarily made of silicon carbide (SiC) semiconductor material and capable of voltage driving through an insulated gate.

Devices that handle a large amount of electric power, so-called power devices, have been conventionally manufactured by primarily using silicon semiconductors. Since a power device can have a large electric current capacity, it often has a structure in which electric current flows in the thickness direction (vertical direction) between the two principal planes of the chip. Among such conventional power devices, FIG. 9 is a cross-sectional view of a conventional representative vertical insulated gate field effect transistor (MOSFET).

The cross-sectional view of a semiconductor substrate shown in FIG. 8 is the basic structure of a well known device called a static induction transistor (hereinafter abbreviated as "SIT"). This structure includes gates obtained by selectively burying $p^+$ regions 4 in an n-type high-resistance drift layer 3 deposited on an $n^+$ semiconductor substrate 1. When a negative bias with respect to a drain 6 provided on the underside of the semiconductor substrate 1 is applied to the gate, a depletion layer expands in a pinch-off region 9 provided between each pair of the $p^+$ regions 4, which are the gates, and blocks the electric current path from the drain 6 through the pinch-off region 9 and an $n^+$ source region 7 to a source 8. Such a SIT devices are characterized by a monopolar structure in which electric current basically only flows through n-type regions, so that small on-resistance close to an ideal value is likely provided. Prototype devices have been reported having the SIT structure using SiC semiconductors with excellent characteristics as well as those using silicon semiconductors. In the basic structure of the SIT device, however, each of the gates 4 is formed by means of a pn junction. Therefore, when the junction gets degraded or the gate circuit malfunctions, the gate bias becomes defective, so that the device remains conducting, possibly resulting in a serious failure, such as breakdown of the circuit in the worst case. Accordingly, use of the SIT device requires caution in the gate bias conditions, which poses difficulty in using the SIT device.

The vertical MOSFET, an insulated gate device, is frequently used as the power device described above, and is shown in the cross-sectional view of FIG. 9. FIG. 9 shows a typical planar gate MOSFET in which gate insulating films 24 and gate electrodes 23, each having a flat shape, are formed on the principal plane of a semiconductor substrate (20+22a). $N^+$ regions 28 and a $p^+$ region 26 that is provided to make ohmic contact are provided in a p-well 25. In FIG. 9, $n^+$ surface regions 22b that are provided immediately under the gate insulating films 24 and located outside the p-well 25 in the substrate surface are not formed in many cases. When reduction in size of the unit pattern for lowering on-resistance narrows the n-type region immediately under the gate sandwiched between the p-wells 25 in adjacent unit patterns, the pinch-off resistance increases because a depletion layer expands when a bias is applied to a drain 29. To prevent the pinch-off resistance and hence the on-resistance from increasing, the high-concentration $n^+$ surface regions 22b are provided. The concentration (impurity concentration) is approximately $1 \times 10^{18}$ cm$^{-3}$ at the most, because higher concentrations prevent the depletion layer from expanding along the surface, resulting in reduction in blocking voltage. Reference numeral 30a denotes an interlayer insulating film, and reference numeral 27 denotes a source.

In the vertical MOSFET, unlike the SIT, the on-resistance of the element includes not only the resistance of the n-type semiconductor region (the high-resistance drift region, in particular) but also the channel resistance in the MOSFET portion. On the other hand, the total resistance of the channel regions in the whole element decreases when the size of the unit pattern is reduced to increase the channel density, since the channels are connected in parallel in terms of an equivalent circuit. Accordingly, to lower the on-resistance of the whole element, the unit pattern is preferably formed in such a way that the channel density increases.

The cross-sectional view of FIG. 10 shows a conventional trench gate MOSFET devised in such a way that more reduction in channel resistance through the size reduction is achieved. The same reference characters shown in FIG. 10 as those in FIG. 9 indicate the regions having similar functions. In the device illustrated in FIG. 10, the impurity concentration of an n buffer layer 21 is higher than an impurity concentration of a $n^-$ region 22a and is lower than an impurity concentration of an n+ semiconductor substrate 20. In the MOS gate structure indicated by the reference numerals 23, 24, and 10 in FIG. 10, a trench 10 extends downward perpendicularly to the principal plane in such a way that the trench 10 extends through the p-well 25 and reaches the n region 22a, so that the trench density along the surface can be easily enhanced. The MOS gate structure (23, 24, and 10) therefore easily achieves a higher channel density than that in the planar gate structure shown in FIG. 9. Furthermore, in this structure, the fact that no n-type region sandwiched between the p-wells structurally lowers the pinch-off resistance makes the trench gate MOSFET more advantageous than the planar gate MOSFET from the viewpoint of the pinch-off resistance.

However, in a silicon power device, since the channel density has been maximized by making full use of the fabrication technology of the trench gate structure and the LSI microprocessing technology, the characteristics of the silicon power device have approached the limit determined by the material. To break through this material limit, there have been attempts to change the semiconductor material from silicon to any of those having broader band gaps, such as SiC and GaN. Since the maximum breakdown fields of these materials are larger by approximately one order of magnitude than that of silicon, it is expected that use of any of these materials for a power device lowers the resistance of the element to one hundredth or smaller. Prototypes of SiC-MOSFET devices and SiC-SIT devices having structures similar to those of silicon devices have been built and have shown excellent characteristics.

For example, JP-A-2006-147789 filed by Yatsuo et al. (corresponding to International Patent Application WO 2006/054394 A1, and corresponding to European Patent Application EP 1,814,162 A1) describes an SiC-MOSFET in which the on-resistance is lowered by forming a structure including an $n^+$ SiC substrate, an n-type drift layer stacked thereon, a high-concentration p-gate layer buried therein, and a MOS channel region further formed thereon, the MOS channel region being a low-concentration p-type deposition layer. It is necessary to selectively convert the p-type deposition layer into an n-type base region through ion implantation to form an electric current path. However, the n-type base region cannot be thick due to the practical limit of depth to which ions can be implanted (equal to the thickness of the p-type deposition layer), so that a high electric field is applied to the gate insulating film and hence the off-state voltage cannot be improved. To solve this problem, Yatsuo et al. report interposing a low-concentration n-type deposition layer between the low-concentration p-type deposition film and the high-concentration gate layer of a SiC MOSFET. The base region converted into the n-type through ion implantation is selectively formed in the low-concentration p-type deposition film so as to increase the thickness of the n-type deposition film between the high-concentration gate layer and the low-concentration p-type deposition film (channel region).

As described above, a MOSFET made of silicon carbide semiconductor is expected to have excellent characteristics because its dielectric breakdown field is higher than that of a silicon semiconductor by one order of magnitude. In practice, however, problems result from the fact that $SiO_2$ film is primarily used as the gate insulating film as in a silicon semiconductor. For example, particularly in a trench MOSFET, the electric field concentrates at the corners of the gate insulating film, so that an excessive electric field is applied. An electric field normally applied in SiC cannot therefore be applied, so that only a much lower blocking voltage is provided. Accordingly, to avoid the problem of reduced blocking voltage due to dielectric breakdown of the gate insulating film in SiC, a planar gate MOSFET has been fabricated as a prototype in many cases.

Since a SiC semiconductor has lower channel mobility in a MOSFET than a silicon semiconductor, it is desirable to maximize the channel density so as to lower the channel resistance. However, in a planar gate MOSFET, which suffers from a low level of channel size reduction as described above, a sufficiently high channel density is not always provided. Since an SIT uses no gate insulating film, it does not have the problem described above. However, a SiC-SIT is a so-called normally-on device as in a silicon device, that is, it has source-drain continuity in the no-bias state in which no voltage is applied to the gate. This becomes a problem when a SiC-SIT is actually applied to a circuit, and hence a SiC-SIT is regarded as a hard-to-use device. For example, when a trouble occurs and destroys the gate circuit and no voltage can be applied to the gate, a so-called normally-off device is preferable from the viewpoint of safety because a normally-off power device blocks electric current.

As a method to eliminate the normally-on device function from a power device, there has been proposed a device structure shown in an equivalent circuit in FIG. 7. This device has a structure in which a SIT 18 and a MOSFET 17, which is a low blocking voltage normally-off device, are cascoded. When an off-state signal is applied to the gate 15, the MOSFET 17 becomes blocked, so that the potential at the source region of the SIT 18 increases. A negative bias is therefore applied to the gate of the SIT, so that the SIT 18 is also turned off. This configuration, however, results in a device in which the MOSFET 17 is added to the SIT 18, which means that the advantage of a SiC semiconductor device, small on-resistance with a small area, is lost.

In view of the above, it would be preferable to provide an insulated gate silicon carbide semiconductor device and a method for manufacturing the same, wherein the semiconductor device has a small on-resistance, the advantage of the static induction transistor structure is fully used, and the advantage of the insulated gate field effect transistor structure characterized by the normally-off operation is obtained, in a structure obtained by combining the static induction transistor structure with the insulated gate field effect transistor structure.

SUMMARY

According to the invention, a SIT structure and a MOSFET structure are monolithically mounted on the same SiC semiconductor substrate. The SIT structure includes a p-type gate region buried in a low-concentration n-type drift layer deposited on a high-concentration n-type SiC semiconductor substrate and a high-concentration n-type first source region deposited on the surface of the low-concentration n-type drift layer above the gate region. The MOSFET structure includes a p-type well region deposited on the surface of the first source region, a second source region formed in the surface layer of the p-type well region, and a MOS gate structure formed in a trench extending from the second source region to the first source region. The MOSFET structure is disposed above the SIT structure. Conductive connection means for connecting the buried p-type gate region to a source electrode is also provided. The conductive connection means is preferably a metallic film formed on the surface of a recess extending from the surface of the p-type well region to the buried p-type gate region. The first source region in the SIT structure is preferably a high-concentration region having a concentration of $1\times10^{18}$ $cm^{-3}$ or greater, at which the whole portion is not depleted when a voltage is applied.

The insulated gate silicon carbide semiconductor device is preferably configured in such a way that the p-type gate region and the trench in the MOS gate structure have stripe shapes in the plan view, which are disposed parallel to each other. Alternatively, the insulated gate silicon carbide semiconductor device can be configured in such a way that the p-type gate region and the trench in the MOS gate structure have stripe shapes in the plan view, which are disposed perpendicular to each other.

According to the invention, an insulated gate silicon carbide semiconductor device, and a method for manufacturing the same, are provided, wherein the semiconductor device has small on-resistance, the advantage of the static induction transistor structure is fully used, and the advantage of the insulated gate field effect transistor structure characterized by the normally-off operation is obtained, in a structure obtained by combining the static induction transistor structure with the insulated gate field effect transistor structure.

BRIEF DESCRIPTION OF THE DRAWINGS

The invention will be described with respect to certain preferred embodiments and the accompanying drawings, wherein.

DETAILED DESCRIPTION OF THE PREFERRED EMBODIMENTS

Preferred embodiments of the insulated gate silicon carbide semiconductor device according the invention will be described below in detail with reference to the accompanying drawings. The invention is not limited to the description of the embodiments described below but includes other embodiments as long as they do not depart from the spirit of the invention.

Figure 1:
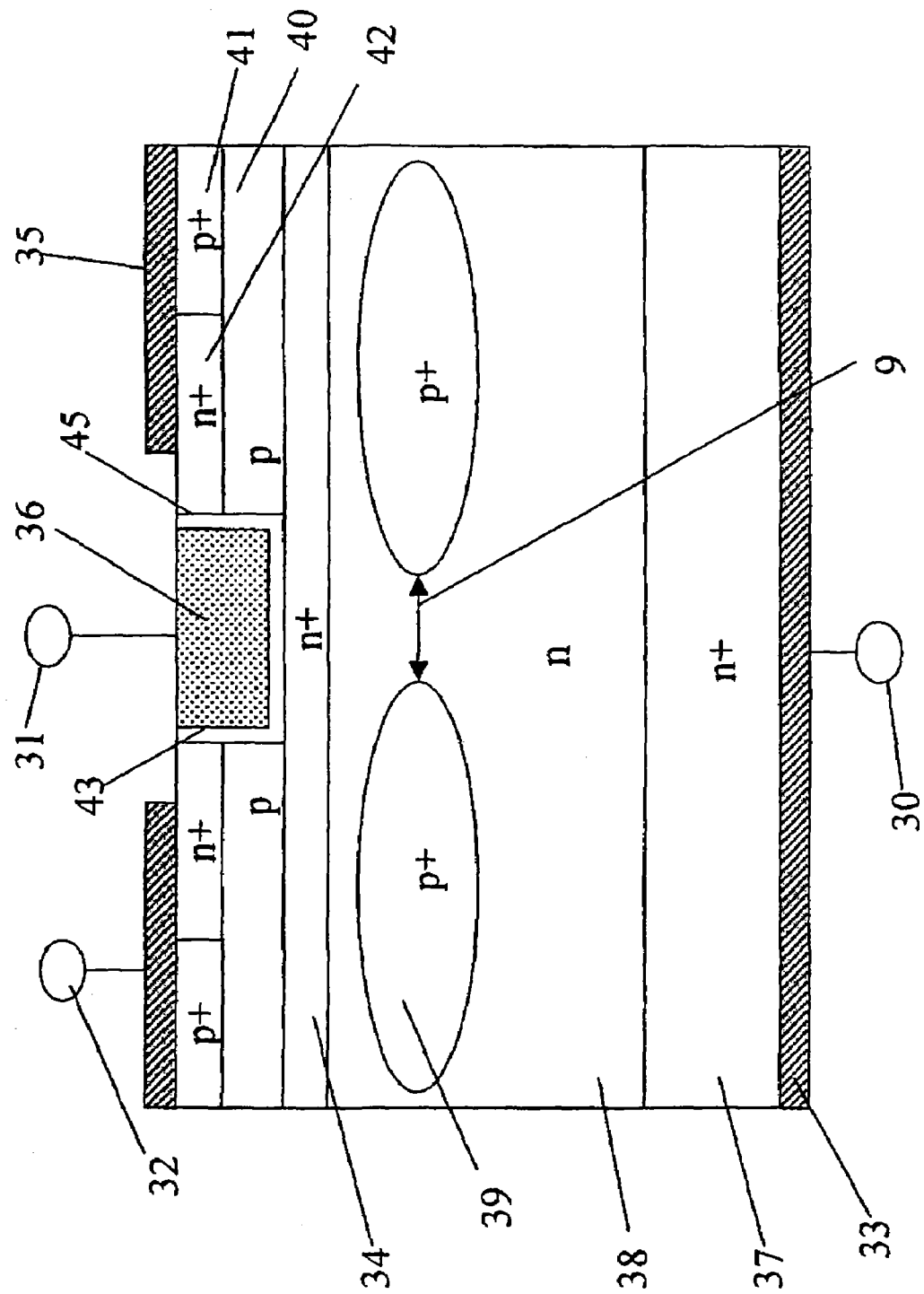
FIG. 1 is a cross-sectional view of the insulated gate silicon carbide semiconductor device according to a first embodiment of the invention.
Figure 2:
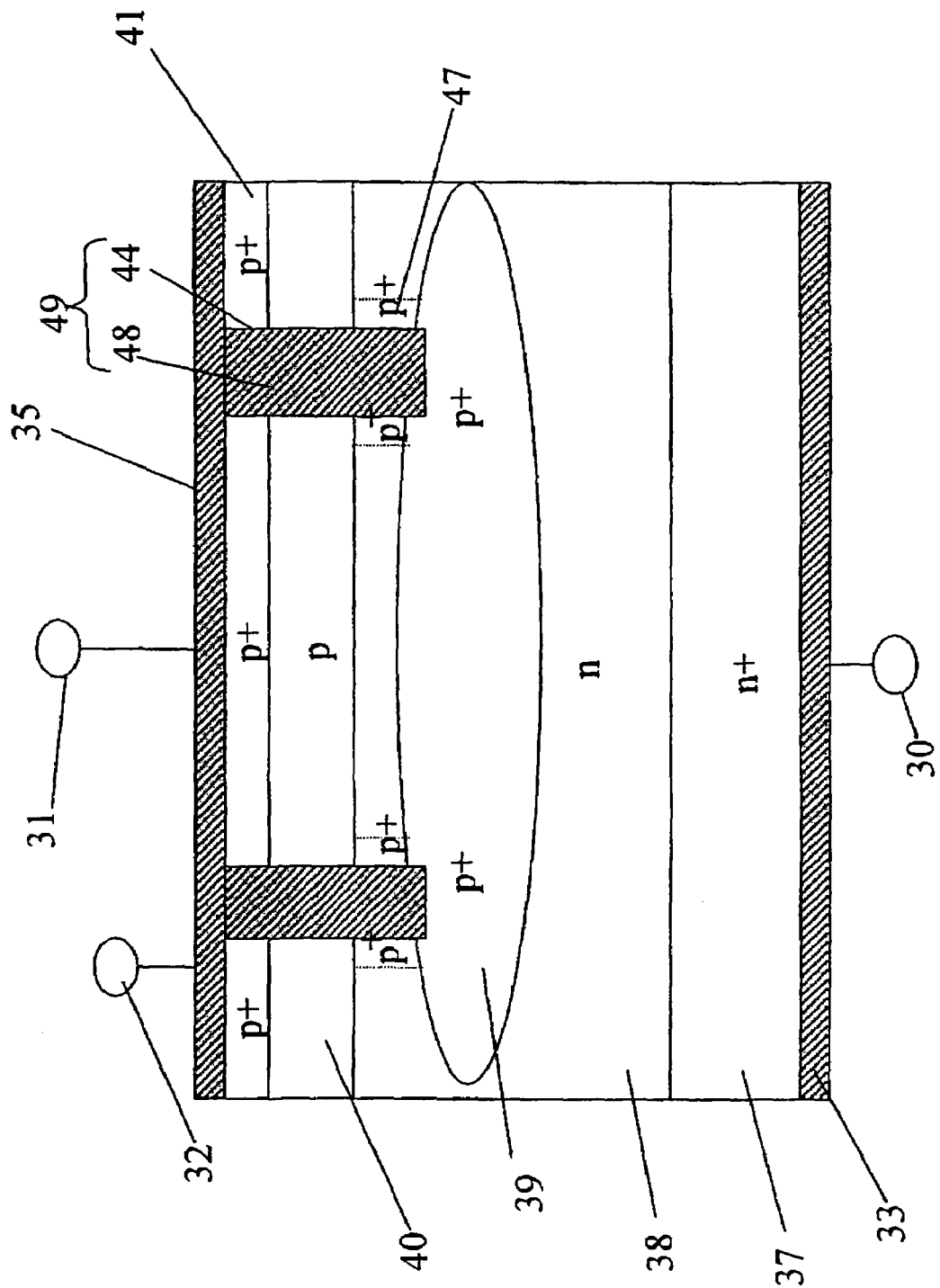
FIG. 2 is a cross-sectional view of the insulated gate silicon carbide semiconductor device according to the first embodiment of the invention taken along a different line.
Figure 3:
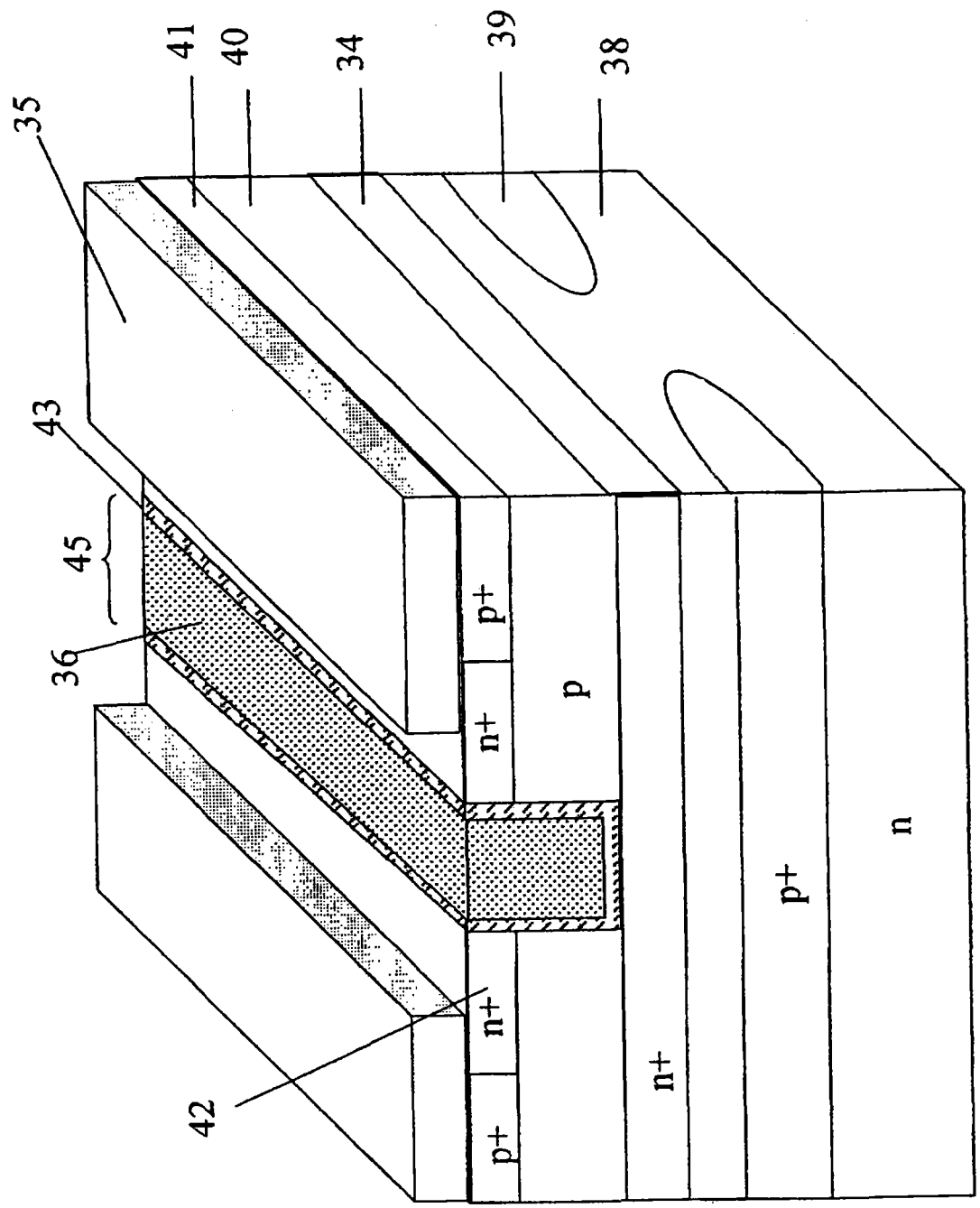
FIG. 3 is a perspective view of the insulated gate silicon carbide semiconductor device according to a second embodiment of the invention.
Figure 4:
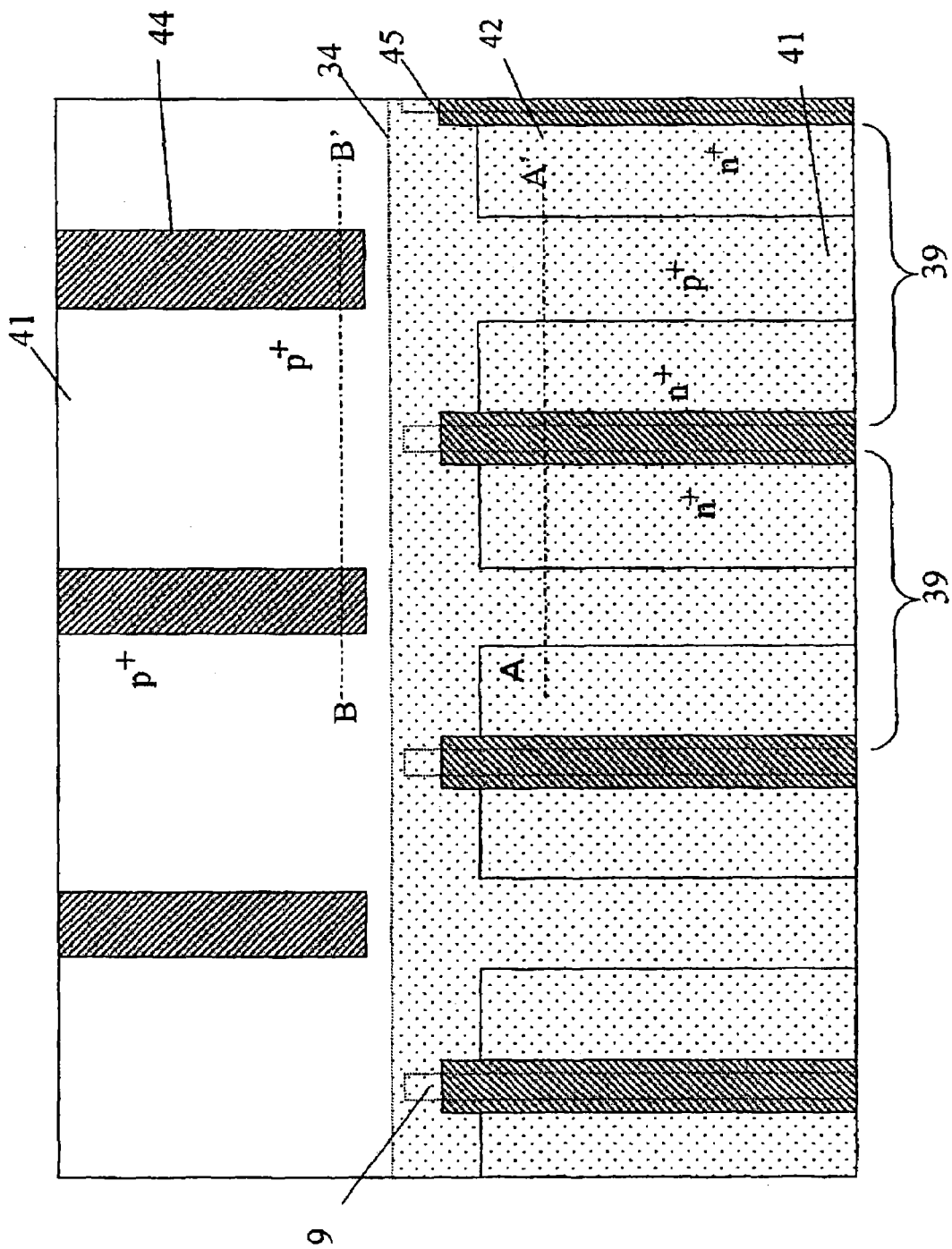
FIG. 4 is a plan view of the insulated gate silicon carbide semiconductor device according to the first embodiment of the invention.
Figure 5:
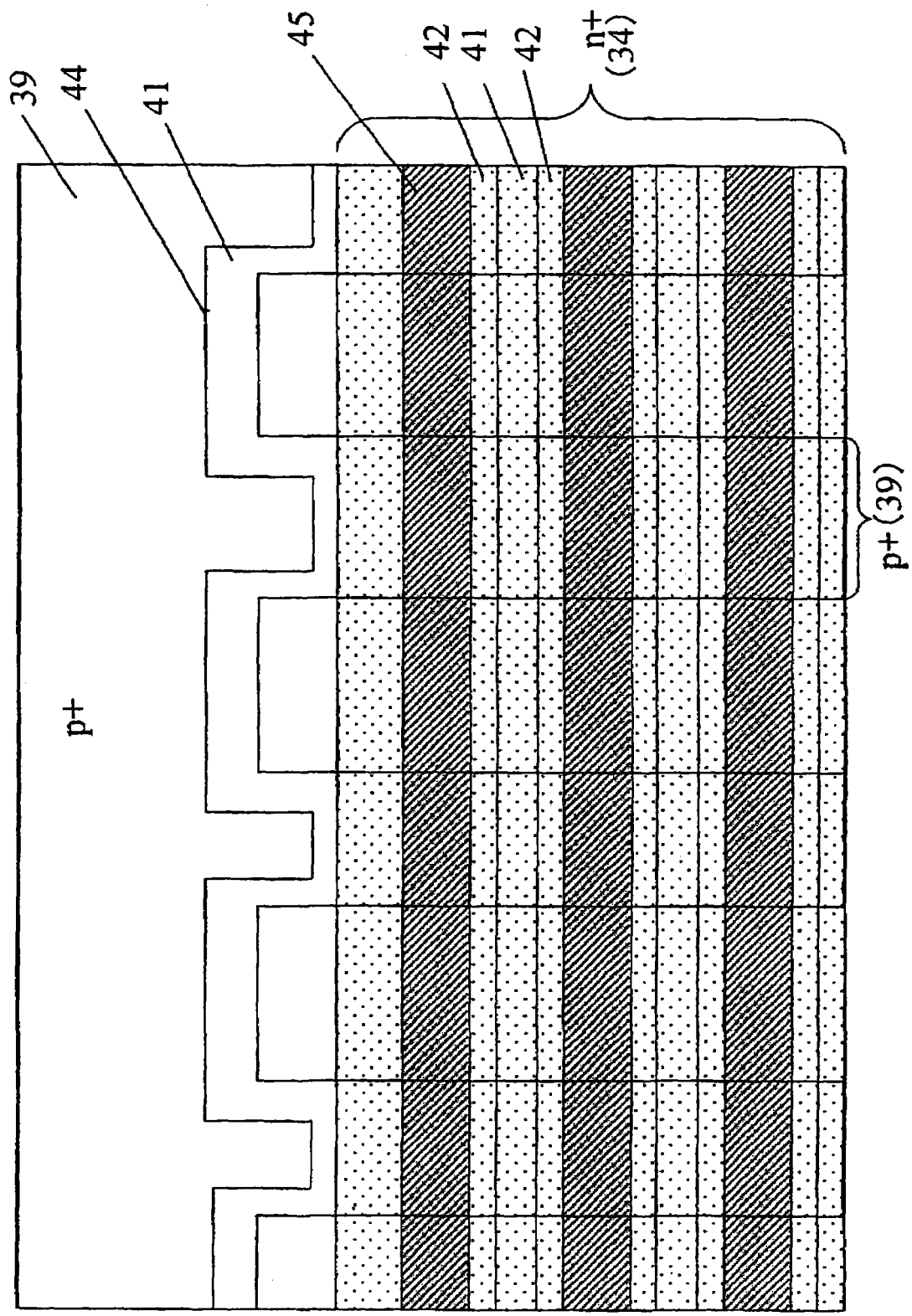
FIG. 5 is a plan view of the insulated gate silicon carbide semiconductor device according to the second embodiment of the invention.

FIGS. 1 and 2 are cross-sectional views of the insulated gate silicon carbide semiconductor device taken along different lines according to a first embodiment of the invention. FIG. 3 is a perspective cross-sectional view of the insulated gate silicon carbide semiconductor device according to a second embodiment of the invention. FIG. 4 is a plan view of the insulated gate silicon carbide semiconductor device according to the first embodiment of the invention with the source electrode removed from the source-side surface. FIG. 5 is a plan view of the insulated gate silicon carbide semiconductor device according to the second embodiment of the invention with the source electrode removed from the source-side surface. FIGS. 6A to 6H are cross-sectional views for explaining the method for manufacturing an insulated gate silicon carbide semiconductor device according to the invention. FIG. 7 is an equivalent circuit diagram of the insulated gate silicon carbide semiconductor device according to the invention.

FIG. 1 shows the first embodiment according to the invention. In FIG. 1, a SIT structure includes an $n^+$ region 34 (first conduction-type first source region), a $p^+$ gate region 39 (second conduction-type gate region), an n-type drift layer 38 in which the $p^+$ gate region 39 is buried, and an $n^+$ substrate 37 formed of a high-concentration silicon carbide semiconductor substrate, which is also a substrate for supporting the regions and layers described above that are disposed in the above order from the front side of the semiconductor substrate (the upper side in the figure). The gate of the SIT structure is the $p^+$ gate region 39 having a pinch-off region 9.

In FIG. 1, the $n^+$ region 34 that plays the role of the source of the SIT structure is not directly connected to an electrode, but also serves as the drain region of a MOSFET structure disposed above the SIT structure, so that the SIT structure is connected to the MOSFET structure. The MOSFET structure uses the $n^+$ region 34 as the drain and includes a p-well region 40, a gate insulating film 43 and a gate electrode 36 formed in a trench 45 extending from the surface of the whole substrate to the $n^+$ region 34, a second source region 42 and a high-concentration $p^+$ contact region 41 formed in the surface layer of the p-well region 40, and a source electrode 35 in contact with the surface regions of both the second source region 42 and high-concentration $p^+$ contact region 41. Reference numeral 31 denotes a gate terminal extended from the gate electrode 36, and reference numeral 32 denotes a source terminal extended from the source electrode 35. A drain electrode 33 is in contact with the underside of the semiconductor substrate 37, and a drain terminal 30 is extended from the drain electrode 33.

When a voltage greater than or equal to a threshold voltage is applied to the gate electrode 36 of the MOSFET structure, a channel (not shown) is formed in the sidewall surface of the p-well 40 that faces the sidewall of the trench 45 via the gate insulating film 43. The SIT structure is serially connected to the MOSFET because the source region 34 (first source region) of the SIT structure also serves as the drain of the MOSFET structure. As a result, the source region 42 (second source region) of the MOSFET structure is extended by the source electrode 35 and hence serves as the source region of the whole element. In the insulated gate silicon carbide semiconductor device of the invention, the structure that maintains a high blocking voltage is similar to the basic structure of the SIT, and the SIT structure is turned off through the pinch-off region 9. The insulated gate silicon carbide semiconductor device can be turned on and off by applying a voltage to the gate 15 (the gate terminal 31 in FIG. 1) of the MOSFET, as shown in the equivalent circuit of FIG. 7, in which the SIT 18 and the MOSFET 17 are cascoded.

This device can basically be a normally-off device because the MOSFET structure is serially connected to the SIT structure. The most voltage is applied between the high-concentration first source region 34 and the drain 30, and very little voltage is applied to the portions of the gate insulating film 43 which is provided at the corners in the trench 45 shown in FIG. 1. Therefore, even when a sufficiently large voltage is applied between the source 32 and the drain 30, the blocking voltage of the whole element will not be limited by the blocking voltage of the gate insulating film because the blocking voltage of the gate insulating film in this structure does not decrease due to electric field concentration. Furthermore, in addition to the fact that the high-concentration source region 34 in the SIT structure prevents electric field concentration to the gate insulating film, the provision of the high-concentration source region 34 provides another advantage of reducing the size of the pinch-off region 9. Therefore, even when the MOSFET structure is serially added to the SIT structure, the resistance does not increase, allowing the resistance of the whole element to be suppressed to a small value. Moreover, such a configuration of the invention solves the disadvantages of the SIT device and the MOSFET device in a complementary manner, allowing a device using excellent characteristics of both the devices to be provided.

Furthermore, the insulated gate silicon carbide semiconductor device of the invention is characterized in that the positional relationship between the SIT structure and the MOSFET structure formed thereabove is not fixed, but these devices can be designed independently under a certain constraint. Although FIG. 1 shows an example in which the SIT portion including the buried $p^+$ region 39 and the MOSFET portion including the trench gate 36 are arranged at the same pitch, for example, only the pitch of the gate electrodes 36 may be shorter to further lower the resistance in the MOSFET. The insulated gate silicon carbide semiconductor device of the invention is also characterized in that it is not necessary to make contact between the p-type gate region 39 in the SIT structure and the source electrode 35 for each unit pattern, but the contact is made by a metallic film formed in a recess or a trench provided in a separate region for making contact between the p-type gate region 39 and the source electrode 35, allowing further increase in density of the trench MOS gate channels.

As for the impurity concentration in each of the regions in the SIT structure and the MOSFET structure according to the invention, the p$^+$ gate region 39 in the SIT structure preferably has the highest possible concentration and the lowest possible resistance, for example, the impurity concentration preferably ranging from approximately $1\times10^{19}$ cm$^{-3}$ to $1\times10^{21}$ cm$^{-3}$. The p-well region 40 in the MOSFET structure preferably has an impurity concentration ranging from approximately $5\times10^{16}$ cm$^{-3}$ to $5\times10^{17}$ cm$^3$. Since the n$^+$ region 34 (first source region) also needs to have low resistance, the impurity concentration preferably ranges from approximately $1\times10^{19}$ cm$^{-3}$ to $1\times10^{21}$ cm$^{-3}$. The width of the channel region 9 in the SIT, which is the distance between the p$^+$ gate regions 39, ranges from approximately 0.5 to 5 µm. In the first embodiment shown in FIG. 1, although the n$^+$ region 34 in the SIT structure is uniformly provided not only immediately above the channel regions 9 but also immediately above the p$^+$ gate regions 39, the role that the n$^+$ region 34 should perform can be achieved as long as the n$^+$ region 34 is present at least immediately above the channel regions 9. Although the trench-shaped MOS gate structure in FIG. 1 is positioned immediately above the channel region 9 between the p$^+$ gate regions 39, the MOS gate structure does not have to be positioned immediately above the channel region 9 or formed in correlation with the channel region 9.

In the insulated gate silicon carbide semiconductor device of the invention, the p$^+$ gate region 39 in the SIT structure needs to come into conductive contact with the source electrode 35 of this device. The cross-sectional view of FIG. 1, however, shows no SIT gate-MOS source contact mechanism. The cross-sectional view of FIG. 2 of the insulated gate silicon carbide semiconductor device of the invention taken along a line different from that used in FIG. 1 shows the SIT gate-MOS source contact mechanism. The SIT gate-MOS source contact mechanism 49 is formed in a region different from the region where the primary electric current flows, as shown in FIG. 1. As shown in the cross-sectional view of FIG. 2, in this different region, the n-type regions, which are the first source region 34 in the SIT structure and the second source region 42 in the MOSFET structure, are removed from the drift layer 38, so that there are only the p-type regions (40 and 41). In FIG. 2, the p$^+$ gate region 39 comes into contact with the surface source electrode 35 through a conductor 48, which is a coating formed of an Al/Ti/Ni/Au film or an electrode made of metal, such as tungsten, buried in a contact trench 44 extending perpendicularly from the surface. In the n-type drift layer 38 in the semiconductor substrate, the region 47 in contact with the sidewall of the contact trench 44 is desirably covered with high-concentration p$^+$ portion so as not to be in direct contact with the n region, or a Schottky junction is desirably formed by interposing a metal exhibiting the Schottky effect between the region 47 and the n region. In FIG. 2, a p$^+$ region is formed as the contact region 47. By thus configuring the contact mechanism 49, the contact mechanism 49 can block short-circuit current from flowing into the n-type drift region 38 by means of the pn junction (or the Schottky junction).

FIG. 3 is a perspective view showing a second embodiment directed to the insulated gate silicon carbide semiconductor device of the invention. The basic operation of this insulated gate silicon carbide semiconductor device is the same as that shown in FIG. 1 except that the planar stripe pattern of the p$^+$ gate regions 39 in the SIT structure perpendicularly intersects the planar stripe pattern of the MOS gate structure formed in the trench 45.

Plan views of FIGS. 4 and 5 show examples of the pattern in the surface for the first and second embodiments according to the invention. FIG. 4 according to the first embodiment shows the case where the planar shape of the p$^+$ gate region 39 indicated by the dotted area (because the p$^+$ gate region 39 is the underlying layer viewed from the front side) has a parallel relationship with the planar shape of the trench 45 in the MOS gate structure and they are disposed at the same pitch. The upper part of FIG. 4 is the region, separate and different from the primary electric current region, for making contact between the source electrode 35 and the p$^+$ gate region 39 in the underlying layer, while the lower part of FIG. 4 is the region where the primary electric current flows. Since the region for making contact between the source electrode 35 and the p$^+$ gate region 39 in the underlying layer is formed throughout the upper part of FIG. 4, which corresponds to the region where the primary electric current flows shown in the lower part of FIG. 4, no contact region is required for each unit pattern in the primary electric current region. The width of the SIT channel region 9 in the primary electric current region can therefore be reduced, allowing increase in channel density and hence reduction in on-resistance. Although the n$^+$ first source region 34 is formed all over the region where the primary electric current flows in FIG. 1, the n$^+$ first source region 34 can function as designed when only provided immediately above the channel region 9 between the p$^+$ gate regions 39 as described above.

FIG. 5 is a plan view showing the case where the stripe pattern of the trench gate structures 45 perpendicularly intersects the stripe pattern of the p$^+$ gate regions 39 in the SIT structure as shown in FIG. 3 (although they perpendicularly intersect with each other in this embodiment, they may intersect with each other at an arbitrary oblique angle). In FIG. 5, the p$^+$ gate region 39 is in contact with the source metallic electrode 35 (not shown) only in the p$^+$ region 39 in the upper part of FIG. 5, which is the exposed p$^+$ region 39 obtained by etching away the drift layer 38, the p-well 40, the p$^+$ region 41 and the like located above the p$^+$ region 39 in the substrate thickness direction. The contact between the p$^+$ gate region 39 and the source metallic electrode 35 (not shown) is achieved by coating a metallic film (not shown) on the surface except the trench gate structure in the plan view of FIG. 5.

In the invention, as shown in FIGS. 1 and 3, the pattern of the MOSFET structure can be formed independent of the pattern of the gate region in the SIT structure. FIG. 1 or FIG. 3 may be selected as required because there is a certain degree of flexibility in extending the gate electrode 36 and the source electrode 35.

FIGS. 6A to 6H show an example of the method for manufacturing an insulated gate silicon carbide semiconductor device according to the invention, each cross-sectional view showing each key manufacturing process. In FIGS. 6A to 6H, although the manufacturing method is described with reference to the insulated gate silicon carbide semiconductor device shown in FIG. 1, the basic portion of the manufacturing method can use similar manufacturing processes also when the insulated gate silicon carbide semiconductor device shown in FIG. 3 is manufactured.

The wafer used in this method has the n-drift region 38 epitaxially formed on the high-concentration SiC single crystal substrate 37 with the thickness and impurity concentration of the n-drift region 38 controlled according to the blocking voltage. The material of the semiconductor regions to be described below will not be particularly described, but all the semiconductor regions are made of SiC semiconductor.

Figure 6:
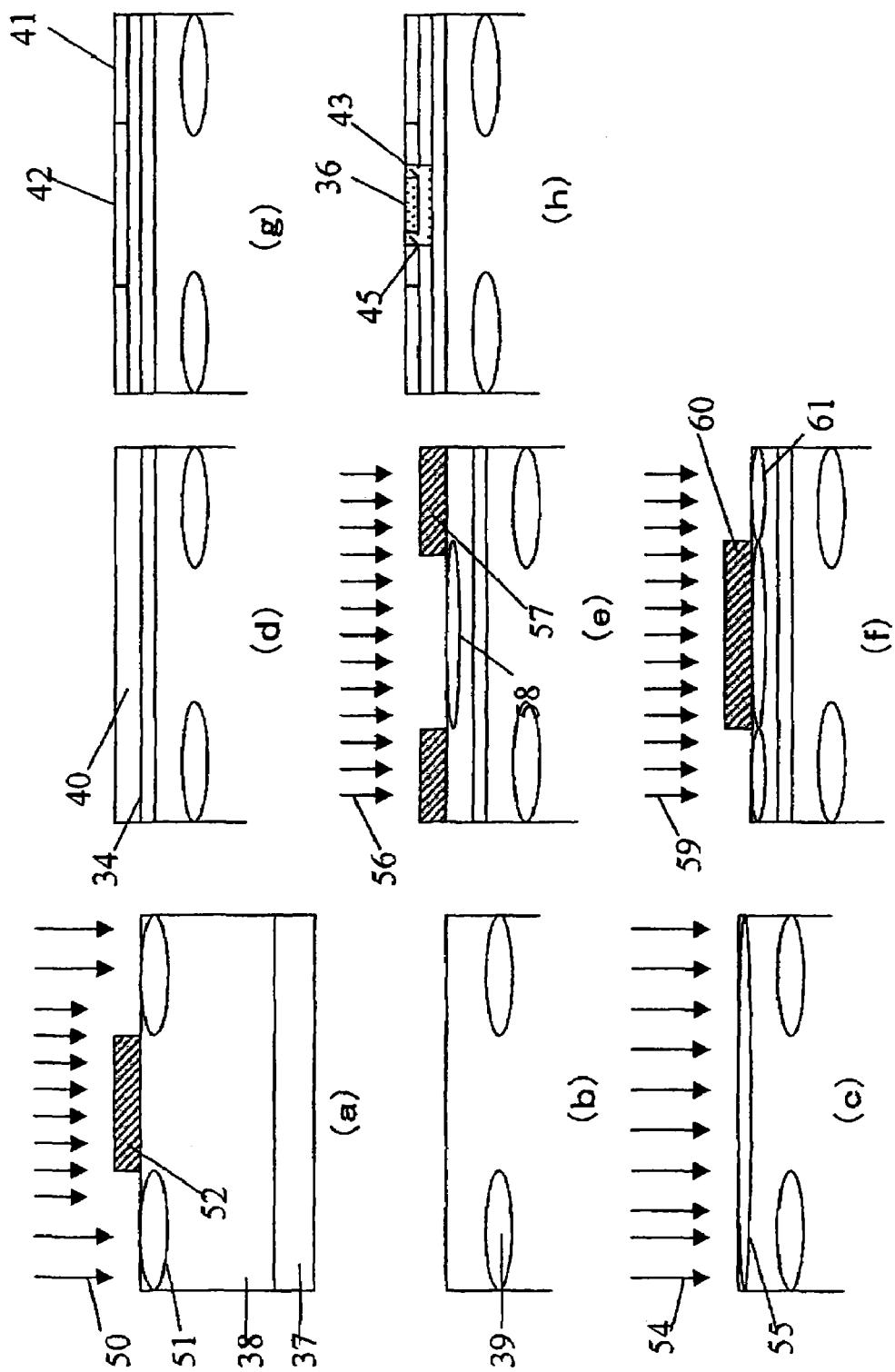
FIGS. 6A to 6H are cross-sectional views for explaining the method for manufacturing an insulated gate silicon carbide semiconductor device according to the invention.
Figure 7:
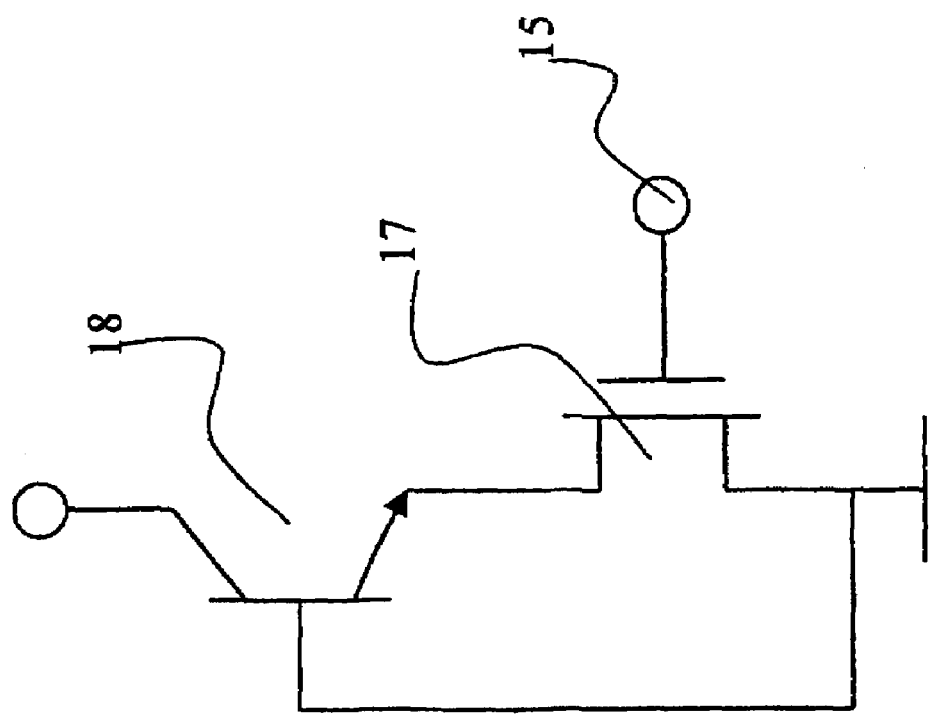
FIG. 7 shows the cascode connection between the SIT structure and the MOSFET structure in the insulated gate silicon carbide semiconductor device according to the invention.
Figure 8:
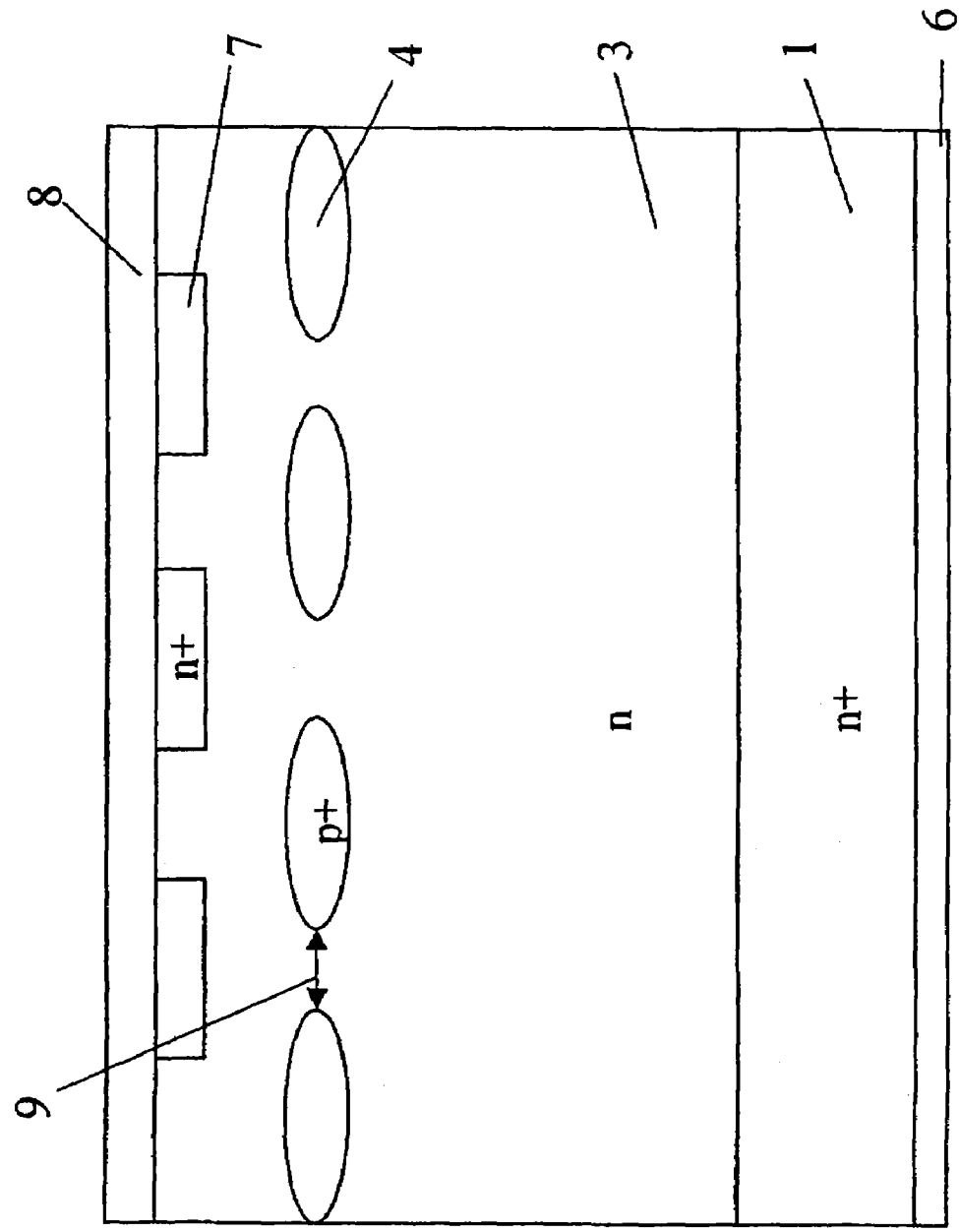
FIG. 8 is a cross-sectional view showing the basic structure of a conventional static induction transistor.
Figure 9:
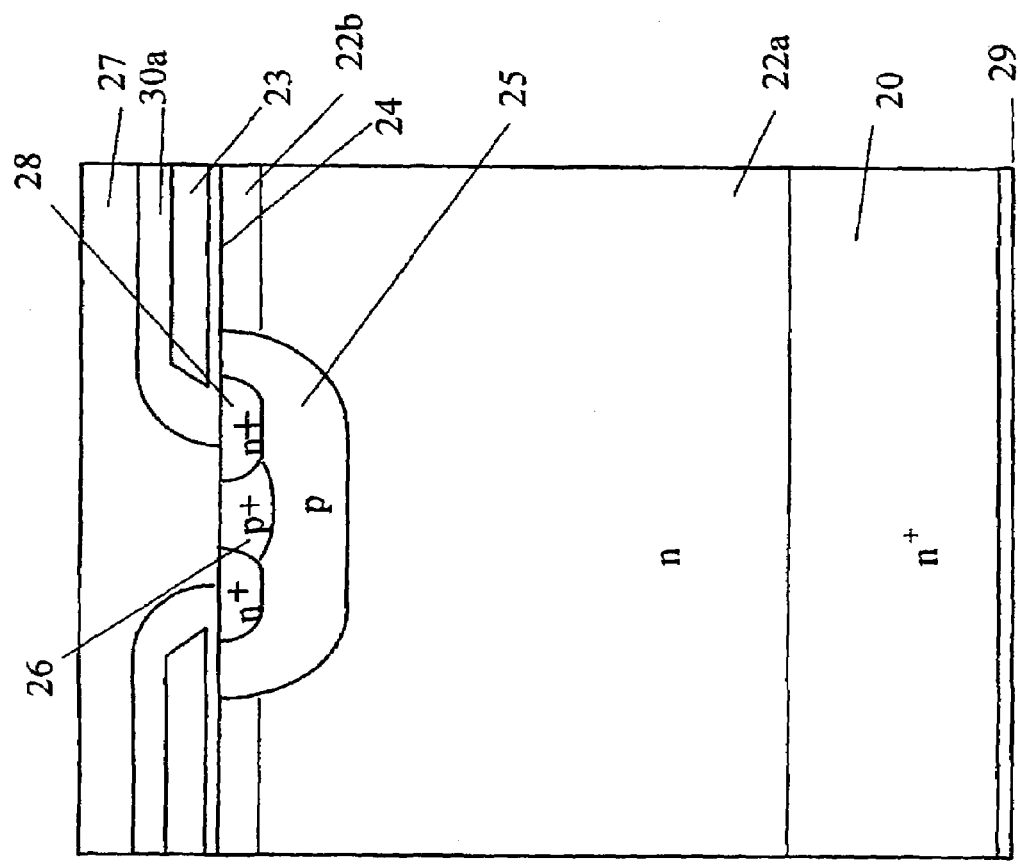
FIG. 9 is a cross-sectional view showing the structure of a conventional vertical planar gate MOSFET.
Figure 10:
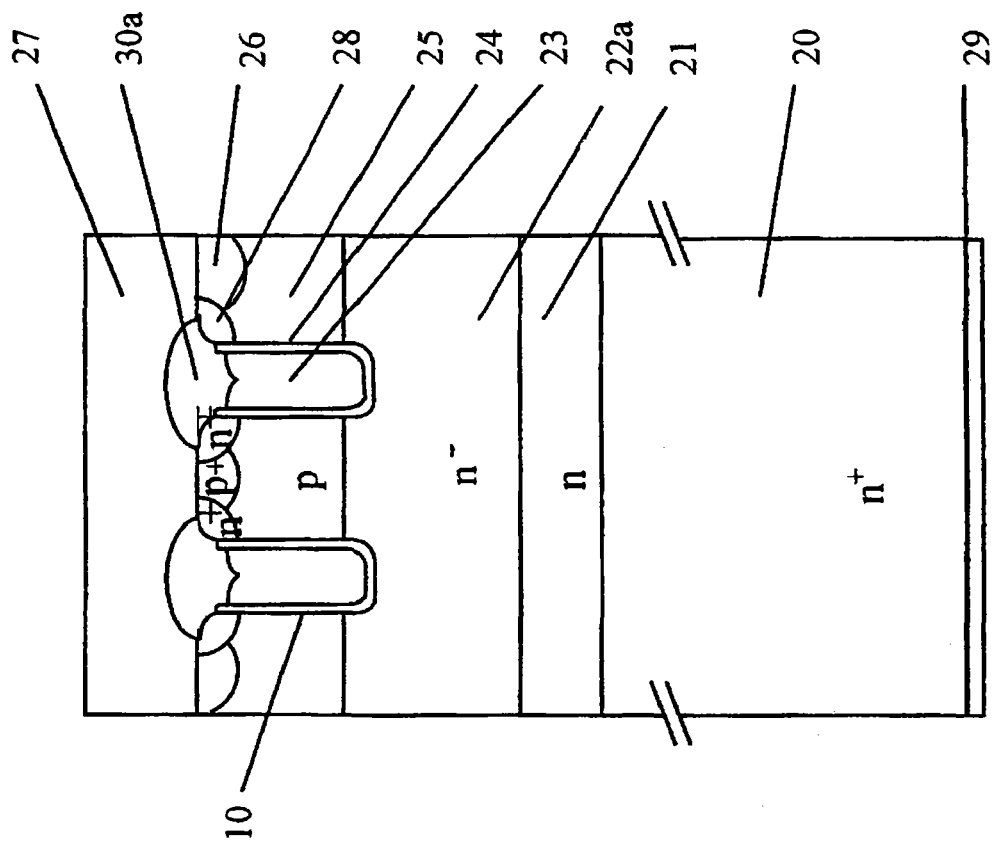
FIG. 10 is a cross-sectional view showing the structure of a conventional vertical trench gate MOSFET.

To form the region that becomes the gate of the SIT, p-type impurity ions, for example, boron and aluminum, are implanted as indicated by the arrows 50 in FIG. 6A. Since the region 51 formed through this ion implantation becomes the gate of the SIT, the region 51 preferably has the highest possible concentration, desirably $1\times10^{19}$ cm$^{-3}$ or higher. By performing the implantation at a high temperature of approximately 500° C., activation is easily carried out in the subsequent heat treatment. A SiO$_2$ film or the like, which withstands high temperatures, is therefore used for an ion plantation mask 52.

In FIG. 6B, after heat treatment for activation has been carried out to form the p$^+$ gate regions 39, an n-type epitaxial layer having an impurity concentration comparable to that of the drift region 38 is formed to a thickness of approximately 0.5 to 3 μm. In FIG. 6C, ion implantation indicated by the arrows 54 is carried out to form a region 55 for forming the source region 34 (first source region) in the SIT. The impurity concentration in this process ranges from approximately $1\times10^{19}$ cm$^{-3}$ to $1\times10^{21}$ cm$^{-3}$. After the ion implantation of an n-type impurity, such as nitrogen and phosphorus, is carried out, high-temperature heat treatment for activation is carried out to form the source region 34 in FIG. 6D.

In FIG. 6D, p-type epitaxial growth is then carried out to deposit the region corresponding to the p-wells 40. In FIG. 6E, a SiO$_2$ film 57 is used as a mask to form the region 58 that becomes the source region (second source region) in the MOSFET through ion implantation indicated by the arrows 56. In this case as well, by performing the ion implantation 56 of nitrogen or phosphorous, which is the n-type impurity, at a high temperature, the subsequent heat treatment for activation is easily carried out. The impurity concentration in this process ranges from approximately $1\times10^{19}$ cm$^{-3}$ to $1\times10^{21}$ cm$^{-3}$, so that low-resistance ohmic contact is easily formed between the p-well and the electrode and almost no depletion layer extends into the interior.

In FIG. 6F, to more easily form ohmic contact between the p-well and the electrode, p-type impurity ion implantation for forming the high-concentration p$^+$ region 41 is carried out to form a region 61. In FIG. 6G, the subsequent high-temperature heat treatment for electrical activation is performed on the implanted n-type and p-type impurity ions to form the n$^+$ source region 42 and p$^+$ region 41.

In FIG. 6H, the trench 45, which is the region that becomes the gate of the MOSFET, is formed, and the gate insulating film 43, such as an SiO$_2$ film, which becomes the gate, is formed on the surface of the trench 45 though thermal oxidation or CVD film formation. Then, the gate electrode 36 is formed on the gate insulating film 43. Description of the process of forming the electrodes will be omitted. The contact between the p$^+$ gate region 39 in the SIT and the source metallic electrode 35 shown in FIG. 2 is preferably formed after the process shown in FIG. 6H. In this process, to avoid direct contact between the metallic electrode film 35 and the n-type drift region 38 at the sidewall of the contact trench 44 shown in the cross-sectional view of FIG. 2, a p$^+$ region is formed on the sidewall of the p-well 40 on the trench 44 side, or a metallic material is selected as a contact metal at this portion in such a way that a Schottky junction is formed between the contact metal and the n-type silicon carbide and the electrode is coated with the metallic material. Examples of the Schottky metal that satisfies such a condition are Ni, Ti, Au, and Pt.

As described above, the vertical semiconductor device according to the invention is used in inverters and power conversion devices, and can also be employed in control of electric motors used to drive vehicles.

The invention has been described with respect to certain preferred embodiments thereof. It will be understood that modifications and variations are possible within the scope of the appended claims.

What is claimed is:

1. An insulated gate silicon carbide semiconductor device comprising:
   a first conduction-type high impurity concentration silicon carbide semiconductor substrate;
   a first conduction-type silicon carbide semiconductor drift layer deposited on one principal plane of the substrate, the impurity concentration of the drift layer being lower than the impurity concentration of the substrate;
   a static induction transistor structure including second conduction-type gate regions buried in the drift layer arranged at predetermined intervals in a direction parallel to the principal plane of the substrate and a first conduction-type first source region formed in the surface layer of the drift layer positioned at least above the predetermined interval;
   a MOSFET structure including a second conduction-type well region deposited on the surface of the drift layer, a first conduction-type second source region formed in the surface layer of the second conduction-type well region, and a trench gate in a trench extending from the surface of the first conduction-type second source region through the second conduction-type well region to the first conduction-type first source region, the trench gate having a gate electrode buried in the trench via a gate insulating film that covers the sidewall of the trench; and
   conductive connection mechanism that connects a source electrode coated on the surface including the surface of the second source region to the second conduction-type buried gate region;
   wherein the impurity concentration of the first conduction-type first source region is greater than or equal to $1\times10^{18}$ cm$^{-3}$.

2. The insulated gate silicon carbide semiconductor device according to claim 1, wherein the conductive connection mechanism that connects the source electrode and the second conduction-type buried gate region is a metal formed on the surface in a recess extending from the surface of the second conduction-type well region to the second conduction-type buried gate region.

3. The insulated gate silicon carbide semiconductor device according to claim 1, wherein both the second conduction-type gate region and the trench gate have stripe shapes in the plan view, which are disposed parallel to each other.

4. The insulated gate silicon carbide semiconductor device according to claim 1, wherein both the second conduction-type gate region and the trench gate have stripe shapes in the plan view, which are disposed perpendicular to each other.

\* \* \* \* \*